United States Patent [19]

O'Rourke

[11] Patent Number: 4,795,861
[45] Date of Patent: Jan. 3, 1989

[54] MEMBRANE SWITCH ELEMENT WITH COATED SPACER LAYER

[75] Inventor: James P. O'Rourke, Milwaukee, Wis.

[73] Assignee: W. H. Brady Co., Milwaukee, Wis.

[21] Appl. No.: 121,545

[22] Filed: Nov. 17, 1987

[51] Int. Cl.⁴ .................... H01H 13/70; H05K 1/00; H05K 3/00

[52] U.S. Cl. .................... 200/5 A; 29/846; 174/68.5; 200/292; 361/398

[58] Field of Search .................... 200/5 R, 5 A, 86 R, 200/159 B, 292; 29/622, 846; 174/68.5; 361/416, 397, 400, 401, 402, 404, 406, 409, 410, 411

[56] References Cited

U.S. PATENT DOCUMENTS

| | | | |
|---|---|---|---|
| 3,683,105 | 8/1972 | Shamash et al. | 174/68.5 |
| 3,913,223 | 10/1975 | Gigoux | 174/68.5 X |
| 3,968,336 | 7/1976 | Johnson | 200/5 A |
| 3,996,430 | 12/1976 | Eberwein et al. | 174/68.5 X |
| 4,127,740 | 11/1978 | La Marche | 174/68.5 |
| 4,320,573 | 3/1982 | Larson | 29/622 |
| 4,382,165 | 5/1983 | Balash et al. | 200/5 A |
| 4,385,215 | 5/1983 | Lemberg | 200/5 A |
| 4,414,452 | 11/1983 | Denley | 200/159 B |
| 4,647,729 | 3/1987 | Collar et al. | 200/292 X |

*Primary Examiner*—J. R. Scott
*Attorney, Agent, or Firm*—Quarles & Brady

[57] ABSTRACT

An open-contact membrane switch element (1,2) comprising a plastic film substrate (10) carrying a first conductive circuit (13), a dielectric coating (30) applied to cover the circuit (13) on the substrate (10) in a pattern defining uncoated zones (31,32,34) around each contact (14-17) of the circuit (13), and a second conductive circuit (35) applied on the dielectric coating (30) and having conductive tracks (36,37) electrically interconnected at the uncoated zones (31,32,34) to portions of the contacts (14-17) of the first conductive circuit (13).

6 Claims, 3 Drawing Sheets

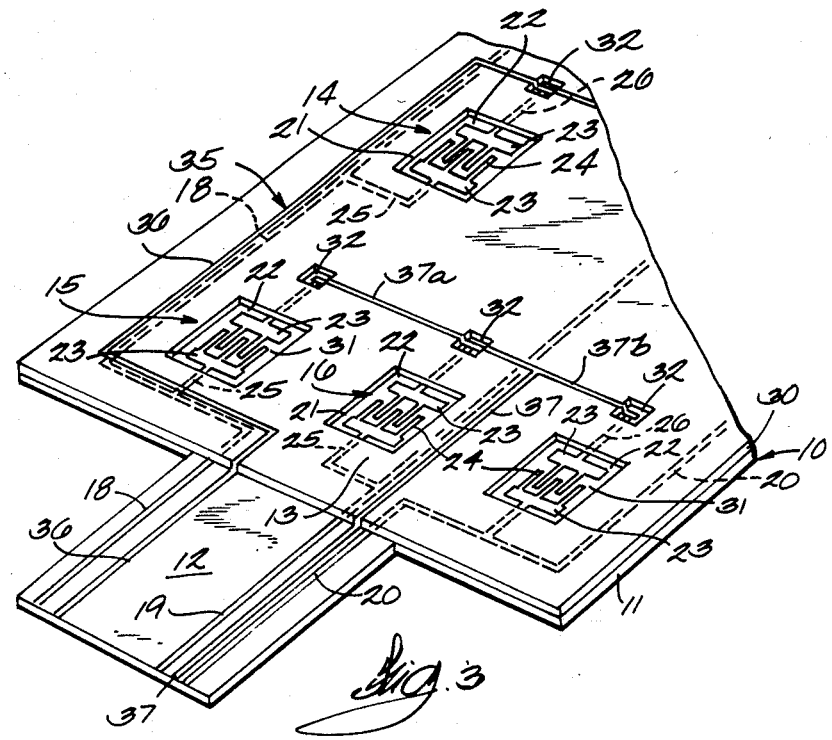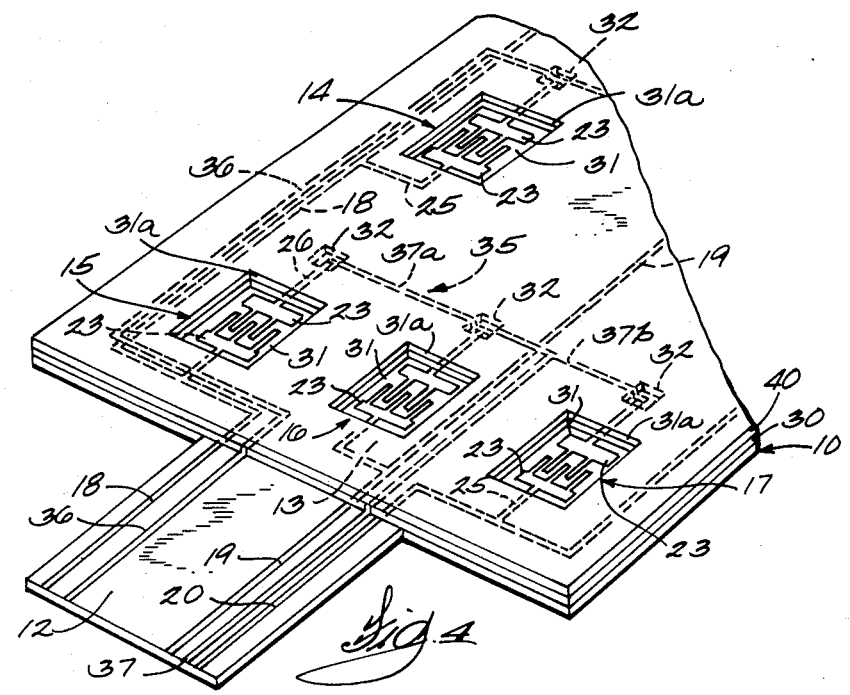

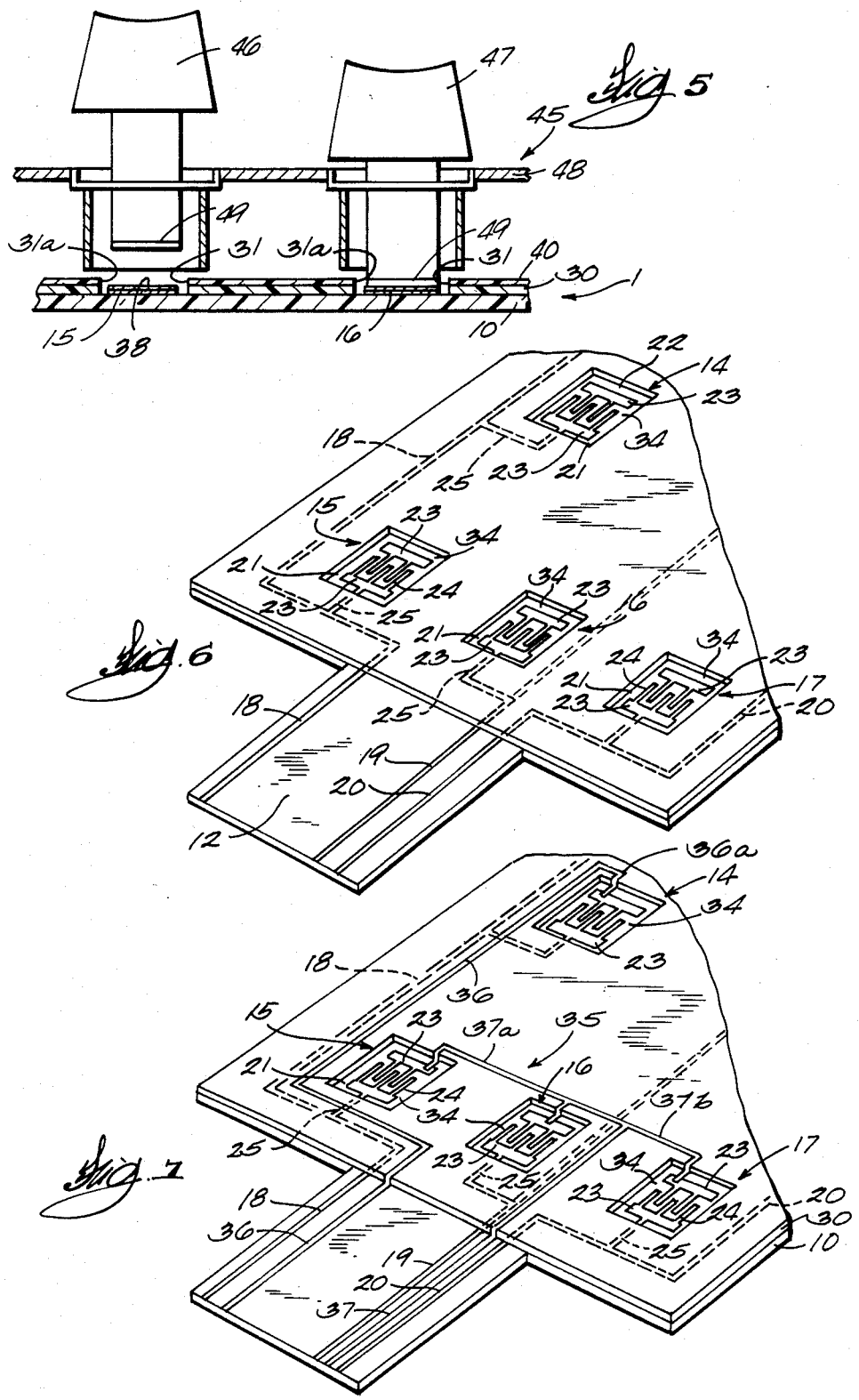

MEMBRANE SWITCH ELEMENT WITH COATED SPACER LAYER

TECHNICAL FIELD

This invention relates to membrane switch elements adapted for use with a keyboard of the type having a contact on the inboard end of the keys, and to methods for the manufacture of the membrane switch elements.

BACKGROUND

Membrane switches are typically constructed of upper and lower plastic films spaced from one another with the two facing surfaces of the films carrying a conductive circuit, which may be printed in conductive ink or applied by vacuum metalizing techniques. The circuits include conductive contacts defining switch cells and conductive tracks leading from each cell to an edge of the films for connection to external circuitry. The films are generally spaced from one another by a die-cut plastic film spacer or an adhesive layer applied in a pattern including apertures. An aperture of the film or adhesive spacer layer is positioned at each switch cell so as to maintain the elements thereof out of contact with each other in a normally nonactivated condition. A switch cell is activated by depressing the upper film so that its switch element contacts a switch element on the other film to thereby form a closed circuit. A membrane switch will generally have an array of switch cells connected to appropriate drive and sense circuitry that enable the detection of a specific cell that is activated. This type of membrane switch is referred to herein as a closed-contact structure since the contacts of the switch are covered by the plastic films used in its construction; thus the upper film of the switch covers the circuit on the lower film of the switch.

This invention is directed to an open-contact type of membrane switch element, meaning that the contact at each switch cell is exposed, which is designed for use with a keyboard that has one or more keys each having a contact on its inboard end. A principal objective in the development of this invention was to provide an efficient membrane switch element for this type of keyboard, another was to provide a new construction for a membrane switch element for such use, and still another was to provide useful methods for the manufacture of the membrane switch elements. Other principal objects were to provide a low cost construction and to reduce the manufacturing costs required to produce the construction.

These and other features, objectives and advantages of the present invention will become apparent from the description which follows that, in connection with the accompanying drawings, sets forth several embodiments of the invention.

SUMMARY OF THE INVENTION

This invention comprises a membrane switch element having first and second conductive circuits wherein the first circuit is applied to a plastic film substrate, a dielectric coating is applied over the substrate in a pattern including coated and uncoated zones with a first uncoated zone over each switch cell of the first circuit and a second uncoated zone associated with or integral with each first uncoated zone, and the second circuit is carried on a surface of the dielectric coating and includes conductive tracks that are electrically connected to conductive tracks of the first circuit at the second uncoated zones.

DESCRIPTION OF THE DRAWINGS

FIG. 3 is a schematic view in perspective illustrating a third stage in the manufacture of the switch element;

FIG. 4 is a schematic view in perspective illustrating a final stage in the manufacture of the switch element;

FIG. 5 is a a partial cross-sectional view of the switch element of FIG. 4 in combination with a keyboard;

FIG. 6 is a schematic view in perspective similar to FIG. 2 of a second embodiment of the invention; and FIG. 7 is a schematic view in perspective similar to FIG. 3 of the second embodiment of FIG. 6.

DESCRIPTION OF PRESENTLY-PREFERRED EMBODIMENTS

Figure 1:
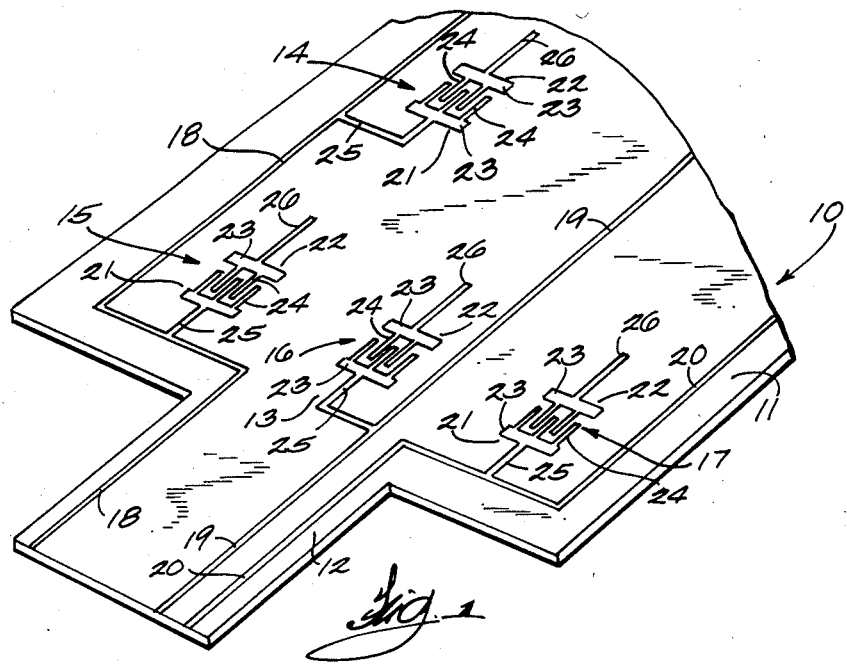
FIG. 1 is a schematic view in perspective illustrating a first stage in the manufacture of a membrane switch element of the invention.

FIGS. 1-4 illustrate several sequential stages in a method for the production of a membrane switch element 1 of the present invention, depicting its structure at the various stages. Sizes and thicknesses are not to scale but are exaggerated in the drawings for clarity of description.

A plastic film substrate 10, referring first to FIG. 1, is die-cut to include a circuit panel 11 and a tail 12 extending from one edge of the panel. A first conductive circuit 13 is formed on the substrate 10 comprising a plurality of conductive contacts 14-17, each contact defining a switch cell, and conductive tracks 18-20. It is understood that FIG. 1 is a schematic representation and that an actual membrane switch element of the invention may include more or less than the number of contacts and conductive tracks shown in FIG. 1. Typically, a membrane switch element of this invention will be employed with a full keyboard such as a QWERTY keyboard and will have a plurality of contacts arranged in rows and columns in an X-Y array as is well known in the art.

The structure of a contact 14-17 is described in detail with reference to contact 14, but it is to be understood that contact structures other than as illustrated in FIG. 1 may be employed with a membrane switch element of this invention. Contact 14 has first and second contact sections 21 and 22, respectively, each including a bar 23 and fingers 24 extending therefrom, with the fingers 24 of a contact section 21 interdigitated with the fingers 24 of a contact section 22.

Conductive lead 25 connects first contact section 21 of contact 14 to conductive track 18. Conductive track 18 extends along panel 11 of the substrate and to the end of tail 12. Another conductive lead 25 connects first contact portion 21 of contact 15 to track 18. Other contacts in the same row as contacts 14 and 15 also would be electrically connected to conductive track 18. A conductive lead 25 connects first contact portion 21 of contact 16 to conductive track 19 which extends along panel 11 and to the end of tail 12 of the substrate 10; other contacts in the same row as contact 16 would be electrically connected to conductive track 19. A conductive lead 25 connects first contact portion 21 of contact 17 to conductive track 20 that extends along panel 11 and to the end of tail 12 of the substrate 10;

other contacts in the same row as contact 17 would be electrically connected to conductive track 20.

A short conductive lead 26 extends from bar 23 of the second contact portion 22 of each contact 14–17. The purpose of the leads 26 will be described later in connection with FIG. 3.

The plastic film substrate 10 can be of any non-conductive flexible plastic film suitable for membrane switches. Polyester films, such as polyethyelene terephthalate films are most commonly used. Other plastic films can be used, however, such as polycarbonate, polyimide, nylon, polyolefin, polyvinylchloride and polysulfone films. The plastic film material selected for the substrate can be in the range of about 1 to 20 mils thick, or thicker if so desired, with a 5 mil thick film being generally appropriate for most applications of this invention.

Figure 2:
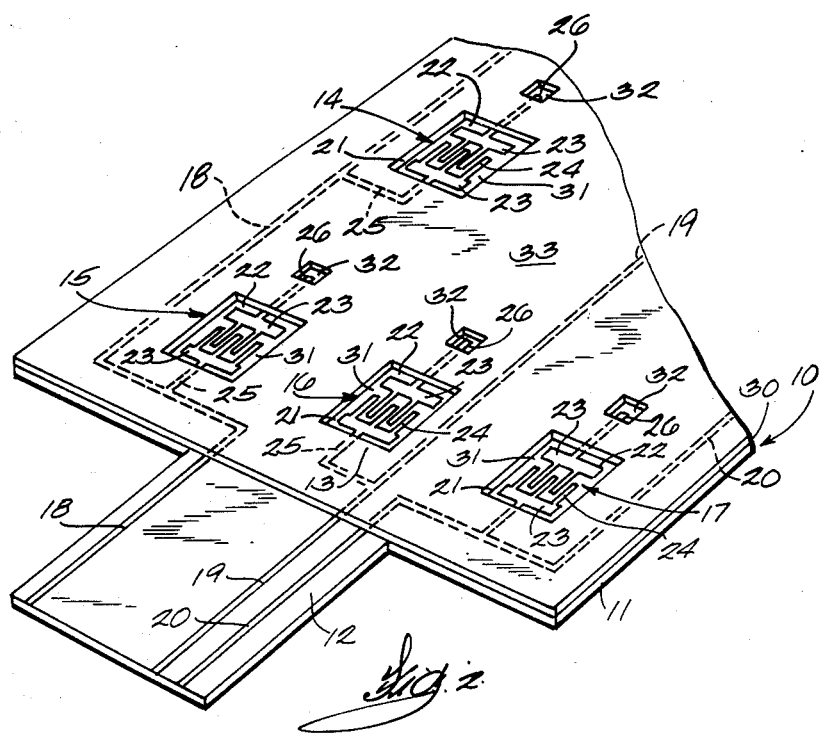
FIG. 2 is a schematic view in perspective illustrating a second stage in the manufacture of the switch element.

Turning now to FIG. 2, a first dielectric coating 30 is applied to cover circuit panel 11 of the substrate 10 in a pattern that defines first uncoated zones 31 and second uncoated zones 32 of the substrate. There is a first uncoated zone 31 and a second uncoated zone 32 associated with each contact of the first conductive circuit 13. Each contact 14–17 of circuit 13 is positioned within a first uncoated zone 31. Further, an end portion of the conductive lead 26 extending from second contact section 22 of each contact 14–17 is positioned within a second uncoated zone 32. The coating 30 further defines a coated zone indicated by the general reference numeral 33 that covers the balance of the first conductive circuit 13 on panel 11; i.e. only the portions of circuit 13 on panel 11 within the first and second uncoated zones are left uncovered by the coating 30. Uncoated zones 31 and 32 are shown as rectangular in shape in FIG. 2, it being understood that they can be of any desired shape such as circular or other configurations. The dielectric coating 30 is most usefully applied by printing techniques, such as by screen printing, for economy of production. The dielectric coating will normally be very thin, on the order of about 0.0005 inches thick when applied by one pass of screen printing; the thickness of the dielectric coating can, however, be built up by two or more printing passes if so desired. After application by a printing technique, the dielectric coating 30 is cured (defined herein as hardening the coating by radiation and vehicle or solvent removal) as necessary to form a hard coating, following which the article enters the third stage illustrated next in FIG. 3.

As shown in FIG. 3, a second conductive circuit 35 is applied to the exposed surface of dielectric coating 30, i.e. the surface thereof opposite from substrate 10. Circuit 35 includes conductive tracks 36 and 37. Track 36 extends along the two edges of the coating and onto tail 12 of the substrate 10 to the end of the tail. Conductive track 37 extends across the coating 30 and across tail 12 of substrate 10, and also terminates at the end of the tail. Track 37 further includes a branch 37a that extends transversely of the substrate to electrically connect with end portions of the conductive leads 26 extending from the second sections 22 of contacts 15 and 16; conductive track 37 also includes branch 37b that extends across the coating to electrically connect with the end portion of lead 26 from second section 22 of contact 17. Similarly, conductive track 36 includes a branch 36a that extends across the coating 30 to make electrical connection with the end portion of lead 26 from second section 22 of contact 14. Branch 36a would extend to other contacts in the same column as contact 14 in a complete array. The electrical connection between tracks 36, 37 and their respective branches with the end portions of leads 26 is made within second uncoated zones 32 defined by the dielectric coating 30. In this fashion, the second uncoated zones 32 act as feed-thru zones for making interconnections between elements of second conductive circuit 35 and elements of first conductive curcuit 13.

In the exemplary form, the first conductive circuit 13 forms the X-portion of the switch matrix, and the second conductive circuit 35 forms the Y-portion of the switch matrix. Conductive circuits 13 and 35 are most usefully applied to the substrate 10 by screen printing the circuits with conductive inks. Many types of conductive inks are well known in the art and commercially available; suitable inks comprise a conductive metal such as silver, gold, copper, etc. in a suitable binder.

After the dielectric coating 30 is cured, it is preferable to apply a carbon conductive ink by printing, such as screen printing, over the elements of the first conductive circuit 13 located in the first uncoated zones 31 and second uncoated zones 32 to build up the height of these elements to match to the height or thickness of the dielectric coating 30. A carbon ink layer is shown in the cross-sectional view of FIG. 5 as layer 38 covering contacts 15 and 16; a similar layer would cover the other contacts of circuit 13. When silver conductive ink is used for the first circuit 13, the addition of a conductive carbon layer over these elements also acts as a passivation layer to protect the silver against oxidative ambient conditions and to prevent migration of the silver.

Turning to FIG. 4, the last stage in the production of a membrane switch element of the invention includes applying a second dielectric coating 40 over first dielectric coating 30. Dielectric coating 40 is applied in a pattern to cover second conductive circuit 35 and includes first uncoated zones 31a that register with the first uncoated zones 31 defined by first dielectric coating 30. The second dielectric coating 40 covers and insulates second conductive circuit 35 and, in combination with coating 30, acts to build up the thickness of the coatings to better function as a spacer element. A completed membrane switch element 1 of the invention is now shown in FIG. 4.

The first dielectric coating 30 and second dielectric coating 40 are preferably applied in liquid form, such as by printing, most preferably screen printing, and then cured to form a hardened coating. Many compositions are suitable for dielectric coatings 30 and 40 include UV curable coatings, solvent coatings and epoxy coatings. Specific examples include a UV curable coating of an acrylate-epoxy resin or a blend of vinyl and acrylate esters, a solvent coating of similar polymers or copolymers, and a bisphenol A-epichlorohydrin epoxy coating.

FIG. 5 illustrates membrane switch element 1 combined with a QWERTY keyboard 45 including reciprocable keys 46 and 47 surrounded by top cover 48 which is supported in a frame, not shown. This combination may be used for a computer keyboard, typewriter, cash register and other types of keyboard terminals. The inboard end of each key carries a conductive contact 49. The membrane switch element 1, which may be supported on a plate not shown, is combined with the keyboard with contact 15 is registry with key 46 and contact 16 in registry with key 47. Contacts 15 and 16 are exposed inasmuch as they are located within the first uncoated zones 31 and 31a of the substrate 10 as defined by dielectric coatings 30 and 40. Key 46 is shown in its unactuated condition, and key 47 is shown in its actuated condition after it has been depressed by a person operating the keyboard. Upon actuation of key 47, contact 49 on its inboard end bridges first and second contact portions 21 and 22 of contact 16, thereby completing an electrical circuit between first conductive circuit 13 on the substrate 10 and second conductive circuit 35 on dielectric coating 30.

Conductive tracks 18, 19 and 20 of the first conductive circuit 13 of switch element 1 terminate at the end of tail 12 of the substrate, and conductive tracks 36 and 37 of the second conductive circuit 35 also terminate at the end of tail 12. Thus, all connections to switch element 1 can be made at a single tail. Appropriate drive and sense circuits are connected to the end of the tail 12 to supply power to the circuits and detect the activation of a selected key. The connections with drive and sense circuitry can be made with any connector well known in the art, such as, for example, a Berg series 65801 connector.

FIGS. 6 and 7 illustrate a membrane switch element 2 that is a further development of this invention. FIG. 6 illustrates switch element 2 at the second stage of its manufacture, similar to FIG. 2, and FIG. 7 illustrates switch element 2 after its third stage of manufacture, similar to FIG. 3. Reference numerals employed in the previous description are used to designate the same or similar elements in FIGS. 6 and 7.

Dielectric coating 30 is applied over circuit panel 11 of the substrate 10 to cover first conductive circuit 13 thereon in a pattern that defines an uncoated zone 34 of the substrate surrounding each of contacts 14-17. In this embodiment of the invention, the first and second uncoated zones 31 and 32 respectively of membrane switch element 1 described above have been combined into a single uncoated zone 34; thus first and second uncoated zones 31 and 32 are integral portions of a single uncoated zone. Turning to FIG. 7, after dielectric coating 30 has been cured to a hard coating, second conductive circuit 35 is printed on top of the coating. The second conductive circuit 35 includes conductive track 36 that has branch 36a which electrically connects to bar 23 of the second contact section of contact 14, the connection being made near the edge of an uncoated zone 34. A similar electrical connection is established between branches 37a and 37b of conductive track 37 between bars 23 of the second contact section of contacts 15-17. Conductive tracks 36 and 37 extend across the circuit panel 11 of substrate 10 and across tail 12 to the end of the tail. The remaining structure of membrane switch element 2 not described is the same as membrane switch element 1 described above.

There has thus been described two forms of an open-contact membrane switch element that meet the objectives of the present invention. The new membrane switch elements disclosed herein can be made entirely by printing techniques after die-cutting of the substrate plastic film, which leads to significant savings in the cost of manufacture of the switch elements. The interconnection between first and second conductive circuit of the switch elements is made along an uncoated zone defined by a dielectric coating such as coating 30 described above, which provides an efficient and economical means for an interconnect. Another significant advantage of the new constructions is that they enable conductive elements of the second conductive circuit to be superimposed upon or crossover conductive elements of the first conductive circuit. This arrangement of conductive elements of one circuit vis-a-vis those of the other circuit is made possible because the dielectric coating 30 acts as an insulator between the two circuits. As an example, referring to switch elements 1 and 2, conductive track 36 of second conductive circuit 35 can be superimposed upon conductive track 18 of the first conductive circuit 13, the tracks 36 and 18 being electrically insulated from one another by the dielectric coating 30. This highly useful advantage of the present invention makes maximum use of the real estate available for the membrane switch element and enables the manufacture of membrane switch elements that occupy a minimum amount of space as compared to other constructions. As an example of this advantage of the present invention, a membrane switch element 2 has been produced having a circuit panel 11 of the substrate that was only 1.5 inches wide by 10 inches long and carried a circuit having 56 key sites. Conductive elements of the first and second conductive circuits were superimposed upon one another, which feature made it possible to produce a switch element of this compact size yet including numerous circuitry elements.

The switch constructions described above are exemplary versions of the concepts of this invention, it being understood that those skilled in the art will be able to devise changes thereto that will remain within the spirit and scope of this invention as set forth in the appended claims.

I claim:

1. In a membrane switch element of the open-contact type adapted for combination with a keyboard having keys with a contact at their inboard end, the switch element including first and second conductive circuits spaced from one another, the improvement comprising:

(1) a flexible plastic film substrate having a circuit panel carrying the first conductive circuit and a tail extending from the panel, the first conductive circuit including (i) a plurality of conductive contacts each having a first contact section and a second contact section electrically separated from each other, and (ii) a plurality of first conductive tracks extending along the circuit panel of the substrate and across the tail to the end thereof, each first contact section being connected to a first conductive track;

(2) a first dielectric coating printed over the circuit panel of the film substrate in liquid form and cured to a solid coating in a pattern defining (i) a first uncoated zone surrounding each contact of the first conductive circuit, (ii) a second uncoated zone associated with each first uncoated zone, and (iii) a coated zone over the balance of the first conductive circuit;

(3) a second conductive circuit on the surface of the first dielectric coating opposite from the film substrate and including a plurality of second conductive tracks extending across the dielectric coating and along the tail of the film substrate to the end thereof, each second contact section of the contacts of the first conductive circuit being electrically interconnected to a second conductive track within a second uncoated zone defined by the first dielectric coating; and (4) a second dielectric coating printed over the first dielectric coating in liquid form and cured to a solid coating in a pattern covering the second conductive circuit on the first dielectric coating and having uncoated zones in registry with the first uncoated zones.

2. A membrane switch element according to claim 1 wherein the first dielectric coating defines a single uncoated zone surrounding each contact of the first conductive circuit and each first uncoated zone and its associated second uncoated zone are integral portions of a said single uncoated zone.

3. A membrane switch element according to claim 1 or 2 wherein the first conductive circuit consists of silver conductive ink printed on the plastic film substrate and carbon conductive ink printed over the elements of the first conductive circuit within the first and second uncoated zones.

4. A method for the manufacture of an open-contact membrane switch element comprising the steps of:
  (1) providing a flexible plastic film substrate having a circuit panel and a tail extending from an edge of the panel;
  (2) printing a first conductive circuit on the film substrate including (i) a plurality of conductive contacts each having a first contact section and a second contact section electrically separated from each other, and (ii) a plurality of first conductive tracks extending along the circuit panel of the substrate and across the tail to the end thereof, each first contact section being connected to a first conductive track;
  (3) printing a first dielectric coating over the circuit panel in a pattern defining (i) a first uncoated zone surrounding each contact of the first conductive circuit, (ii) a second uncoated zone associated with each first uncoated zone, and (iii) a coated zone covering the balance of the first conductive circuit, and thereafter curing the first dielectric coating to a solid coating;
  (4) printing a second conductive circuit on the first dielectric coating that includes a plurality of second conductive tracks extending across the first dielectric coating and along the tail of the film substrate to the end thereof and with each second contact section of the contacts of the first conductive circuit being electrically interconnected to a second conductive track within a second uncoated zone defined by the first dielectric coating; and
  (5) printing a second dielectric coating over the first dielectric coating in a pattern covering the second conductive circuit and the second uncoated zones and having uncoated zones in registry with the first uncoated zones.

5. A method according to claim 4 including the step of printing the first dielectric coating over the circuit panel of the substrate in a pattern defining a single uncoated zone surrounding each contact of the first conductive circuit and combining each first uncoated zone and its associated second uncoated zone as integral portions of a single uncoated zone.

6. A method according to claim 4 or 5 further including the step of printing the first conductive circuit with silver conductive ink and printing carbon conductive ink over the portions of the first conductive circuit within the first and second uncoated zones.

* * * * *